(12) United States Patent
Aoki

(10) Patent No.: US 6,780,681 B2
(45) Date of Patent: Aug. 24, 2004

(54) PROCESS OF MANUFACTURING A SEMICONDUCTOR DEVICE

(75) Inventor: Masayoshi Aoki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/310,889

(22) Filed: Dec. 6, 2002

(65) Prior Publication Data

US 2003/0124814 A1 Jul. 3, 2003

(30) Foreign Application Priority Data

Dec. 27, 2001 (JP) ........................................ 2001-397347

(51) Int. Cl.[7] .............................................. H01L 21/44
(52) U.S. Cl. ........................ 438/124; 438/122; 438/123; 257/787
(58) Field of Search ............................... 438/122–127; 257/783–790

(56) References Cited

U.S. PATENT DOCUMENTS 6,326,243 B1 * 12/2001 Suzuya et al. .............. 438/124
6,476,507 B1 * 11/2002 Takehara .................... 257/787

FOREIGN PATENT DOCUMENTS

JP 8-306817 11/1996
JP 2001-274292 10/2001

* cited by examiner

Primary Examiner—Dung A. Le
(74) Attorney, Agent, or Firm—Staas & Halsey LLP

(57) ABSTRACT

An insulating substrate has a plurality of semiconductor chip mounting sections arranged one by one along a predetermined direction extending from one to the other end of the substrate, and a resin transmitting port. The resin transmitting port is located at a position in the vicinity of the one end along the predetermined direction and other than the semiconductor chip mounting section arranged nearest to the one end. A semiconductor chip is mounted on a respective semiconductor chip mounting section. A mold defines a cavity, including first and second cavity sections on the respective surfaces of the substrate, in such a manner that the first and second cavities communicates with each other by means of the resin transmitting port. A sealing resin is rejected into the cavity, so that the resin flows through the resin transmitting port to fill both of the first and second cavity sections with the sealing resin.

6 Claims, 5 Drawing Sheets

PROCESS OF MANUFACTURING A SEMICONDUCTOR DEVICE

BACKGROUND OF THE INVENTION

1. Field of the Invention

The present invention relates to a wiring substrate for resin molding and a process for manufacturing a semiconductor device into which this wiring substrate is incorporated.

2. Description of the Related Art

As shown in FIG. 8, a board-on-chip (BOC) type semiconductor device is composed in such a manner that a semiconductor chip 12 is fixed to a semiconductor chip mounting section, which is formed on one face of the resin substrate 10, with adhesive 11. Wiring patterns 13, which are formed on the other face of the resin substrate 10, and a terminal section of the semiconductor chip 12, are electrically connected with each other by a bonding wire 15 inserted into a through-hole (slit) 14 formed on the resin substrate 10. Reference numeral 16 is a ball terminal used for the connection with the outside. This ball terminal 16 is arranged on the wiring pattern 13.

A simple BOC type semiconductor device is known in which the bonding wire 15 and the through-hole 14 are sealed only with potting resin. However, in order to enhance the reliability of the semiconductor device, recently, there has been a demand for a semiconductor device in which both the semiconductor chip 12 and the bonding wire 15 are sealed with the sealing resin 17 by means of transfer molding.

FIG. 9 is a view showing an example of the method of manufacturing the above semiconductor device made by means of transfer molding.

According to this manufacturing method, a large number of semiconductor chips are mounted on a wiring substrate of a predetermined width and molded at one time. After that, the resin-molded wiring substrate is cut off and separated into pieces of individual semiconductor devices.

On one face of the strip-like resin substrate 10 of the wiring substrate 18, there are provided a plurality of rows of semiconductor chip mounting sections, which are arranged in the width direction of the resin substrate 10 by a number of pieces (in the case shown in the drawing, the number of pieces is three), in the longitudinal direction of the resin substrate. In the width direction of the resin substrate 10, for each row of the semiconductor chip mounting sections, one through-hole 14 is arranged. On the other face of the resin substrate 10, the wiring pattern 13 (not shown in FIG. 9) is arranged and is electrically connected with the terminal section of the semiconductor chip 12, and is mounted on the semiconductor chip mounting section, via the bonding wire inserted into the through-hole 14.

The semiconductor chip 12 is fixed to each semiconductor mounting section on the wiring substrate 18 with adhesive. After the terminal section of the semiconductor chip and the wiring pattern are connected with each other by the bonding wire, the wiring substrate 18 is incorporated into a metal mold as shown in FIG. 11.

In the semiconductor chip mounting section on each row, one common through-hole (slit) 14 is formed. Therefore, when the semiconductor chip 12 is mounted in each semiconductor chip mounting section, the through-hole portion 14a not covered with the semiconductor chip 12 exists.

When sealing resin is injected into the metal mold in the direction A shown in the drawing, the injected resin flows from the through-hole portion 14a into the opposite side of the resin substrate 10 (the side on which the wiring pattern is formed) as shown in FIG. 11. Accordingly, it is possible to conduct molding of the sealing resin on both the semiconductor chip 12 and the bonding wire 15 at one time. In this connection, FIG. 11 is a sectional view taken on line a—a in FIG. 9, and FIG. 12 is a sectional view taken on line b—b in FIG. 10.

FIG. 10 is a view showing another manufacturing method. According to this manufacturing method, there is provided an independent through-hole (slit) 14 for each semiconductor chip mounting section. The length of this through-hole 14 is determined so that a portion 14a, which is not covered with the semiconductor chip 12 to be mounted, can be generated.

When the wiring substrate 18 is incorporated into the metal mold as shown in FIG. 12 and sealing resin is injected in the direction A shown in the drawing, the injected resin flows from the through-hole portion 14a into the opposite side of the resin substrate 10 as shown in FIG. 12. Therefore, it is possible to conduct resin sealing on both the semiconductor chip 12 and the bonding wire 15 at the same time.

However, the following problems may be encountered in the above-mentioned conventional method of manufacturing the semiconductor device.

As shown in FIGS. 11 and 12, in either of the above manufacturing method, sealing resin simultaneously flows into the opposite side of the resin substrate 10 via the through-hole portion 14a. Therefore, by the pressure of resin which has flowed onto the wiring pattern forming side of the resin substrate 10 from the through-hole portion 14a, there is a tendency that the resin substrate 10 is pushed up. This is a disadvantageous aspect in this method of molding resin.

Due to the foregoing, sealing resin flows out between the resin substrate 10 and the metal mold parting face. Therefore, problems of leakage and a burr of the sealing resin are caused.

Since solvent is mixed in the sealing resin, even when the resin substrate is a hardly raised, the solvent bleeds onto the wiring pattern 13 and deposits on the formation face of the ball terminal 16, which becomes an obstacle to the fixation of the ball terminal 16.

SUMMARY OF THE INVENTION

The present invention has been accomplished to solve the above-mentioned problems.

An object of the present invention is to provide a method of manufacturing a semiconductor device capable of preventing leakage of resin, generation of burr and bleeding of solvent.

Another object of the present invention is to provide a wiring substrate preferably applied to the method of manufacturing the semiconductor device.

According to an aspect of the present invention, there is provided a wiring board adapted to be used for making a resin-molded type semiconductor device, said wiring board comprising: an insulating substrate having first and second surfaces, a plurality of semiconductor chip mounting sections arranged one by one along a predetermined direction on said first surface extending from one end to the other end of the substrate, and a resin transmitting port opened at said first and second surfaces of the substrate and penetrating therethrough, said resin transmitting port being located at a position in the vicinity of said one end along said predetermined direction and other than the semiconductor chip mounting section arranged nearest to said one end.

The substrate further has a plurality of through holes within the respective semiconductor chip mounting sections, in such a manner that, when a semiconductor chip is mounted on the semiconductor chip mounting section of the substrate, said through hole is completely covered by said semiconductor chip at the first surface and terminals of the semiconductor chip are exposed within said through hole.

The respective semiconductor chip mounting sections are all the same size and one equidistantly arranged along said predetermined direction.

The insulating substrate is a longitudinal strip-like resin sheet and said one direction is a width direction of the longitudinal sheet.

According to another aspect of the present invention, there is provided a wiring board adapted to be used for making a resin-molded type semiconductor device, said wiring board comprising an insulating substrate having first and second surfaces, a plurality of semiconductor chip mounting sections arranged one by one along a predetermined direction on said first surface extending from one end to the other end of the substrate, and a resin transmitting port opened at said first and second surfaces of the substrate and penetrating therethrough, said resin transmitting port being located at a position in the vicinity of said one end along said predetermined direction and other than the semiconductor chip mounting section arranged nearest to said one end, a plurality of through holes within the respective semiconductor chip mounting sections, in such a manner that, when a semiconductor chip is mounted on the semiconductor chip mounting section, said through hole is completely covered by said semiconductor chip at the first surface and terminals of the semiconductor chip are exposed within said through hole; and wiring patterns formed on said second surface of the substrate in such a manner that, after a semiconductor chip is mounted on the semiconductor chip mounting section, said terminals of the semiconductor chip can be electrically connected to the wiring patterns by means of bonding wires passing through said through hole.

According to further aspect of the present invention, there is provided a process for making a semiconductor device comprising the following steps of:

preparing an insulating substrate having first and second surfaces, a plurality of semiconductor chip mounting sections arranged one by one along a predetermined direction on said first surface extending from one end to the other end of the substrate, and a resin transmitting port opened at said first and second surfaces of the substrate and penetrating therethrough, said resin transmitting port being located at a position in the vicinity of said one end along said predetermined direction and other than the semiconductor chip mounting section arranged nearest to said one end;

mounting a semiconductor chip on a respective semiconductor chip mounting section;

setting a mold so as to define a cavity including first and second cavity sections on said first and second surfaces of the substrate, respectively, in such a manner that said first and second cavities communicate with each other by means of said resin transmitting port;

injecting a sealing resin into said cavity, so that said resin flows through said resin transmitting port to fill both of said first and second cavity sections with the sealing resin.

The sealing resin is injected into said cavity through a gate located in the vicinity of said other end of the substrate.

The semiconductor chip is mounted on said respective semiconductor chip mounting section by means of adhesive.

The mold comprises a first and second mold sections so as to nip said substrate from said first and second surfaces thereof, respectively, to define said first and second cavity sections on said first and second surfaces of the substrate, respectively.

The sealing resin is injected into the cavity through a gate provided in one of the first and second mold sections and located in the vicinity of the other end of the substrate, in such a manner that the one of the cavity sections is first filled with resin and then the other of said cavity sections is filled with resin.

The substrate preparing step further comprising the following steps of: forming a plurality of through holes within the respective semiconductor chip mounting sections; and forming wiring patterns on said second surface of the substrate; and wherein said semiconductor chip mounting step further comprising the following steps of: completely covering said through hole with said semiconductor chip at the first surface and exposing terminals of the semiconductor chip within said through hole; and electrically connecting said terminals of the semiconductor chip to the wiring patterns by means of bonding wires passing through said through hole.

According to further aspect of the present invention, there is provided a resin-molded type semiconductor device, said wiring board comprising:

an insulating substrate having first and second surfaces, a plurality of semiconductor chip mounting sections arranged one by one along a predetermined direction on said first surface extending from one end to the other end of the substrate, and a resin transmitting port opened at said first and second surfaces of the substrate and penetrating therethrough, said resin transmitting port being located at a position in the vicinity of said one end along said predetermined direction and other than the semiconductor chip mounting section arranged nearest to said one end, a plurality of through holes within the respective semiconductor chip mounting sections, in such a manner that;

wiring patterns formed on said second surface of the substrate;

a semiconductor chip mounted on the semiconductor chip mounting section, in such a manner that said through hole is completely covered by said semiconductor chip at the first surface and terminals of the semiconductor chip are exposed within said through hole;

bonding wires passing through said through hole for electrically connecting terminals of the semiconductor chip to said wiring patterns; and a sealing resin for sealing at least said semiconductor chip, said wiring patterns and said bonding wires.

DETAILED DESCRIPTION OF THE PREFERRED EMBODIMENTS

By referring to the accompanying drawings, a preferred embodiment of the present invention will be explained in detail as follows.

First, the wiring substrate 20 will be explained below.

Figure 1:
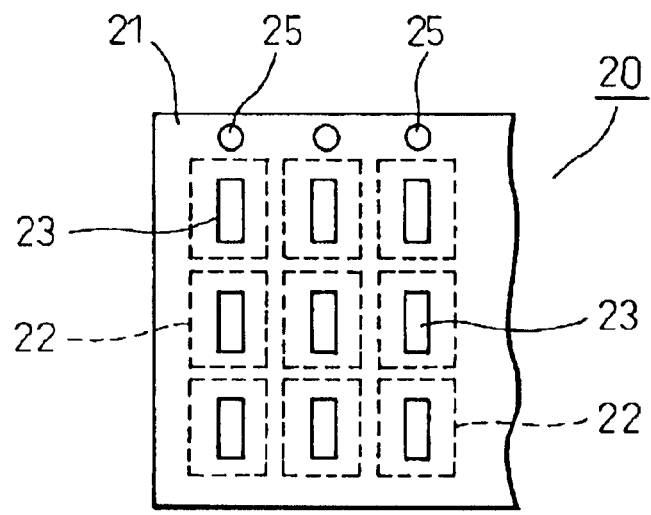
FIG. 1 is a plan view of a wiring substrate.
Figure 2:
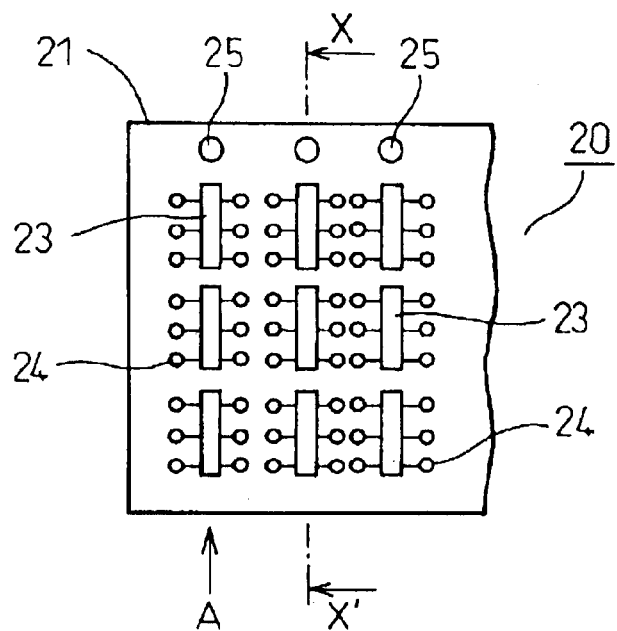
FIG. 2 is a reverse face view of a wiring substrate.

FIG. 1 is a plan view of the wiring substrate 20, and FIG. 2 is a reverse face view of the wiring substrate 20.

On the wiring substrate 20, on one face of the strip-like insulating substrate 21 made of a material such as resin, for example polyimide resin or epoxy resin containing therein glass-crosses there are provided a plurality of rows of semiconductor chip mounting sections 22 in the longitudinal direction of the resin substrate 21 which are arranged in the width direction of the resin substrate 21. In the case shown in the drawing, three semiconductor chip mounting sections 22 are arranged in the width direction of the resin substrate 21.

In each semiconductor chip mounting section 22, there is provided a slit-shaped through-hole 23 which is completely covered by the semiconductor chip to be mounted. In the example shown in the drawing, in each row of semiconductor chip mounting sections in which three semiconductor chip mounting sections 22 are arranged, there is formed a row of through-holes in which three through-holes 23 are arranged. The slit-shaped through-holes 23 arranged on the row of through-holes extend in the same direction (the width direction of the resin substrate 21). Both the length and the width of each through-hole 23 are smaller than the length and the width of the semiconductor chip to be mounted.

On the other face of the resin substrate 21, there is provided a wiring pattern 24 which is to be electrically connected with the terminal section of the semiconductor chip, when it is mounted on the semiconductor chip mounting section 22, via a bonding wire inserted into the through-hole 23.

For each row of the semiconductor chip mounting sections, at one side edge section of the resin substrate 21 which is located at a position on the prolongation of the row of through-holes, there is provided a resin transmitting hole 25 through which resin is to be transmitted from the one side of the resin substrate to the reverse side of the resin substrate 21.

A resin transmitting port 25 is provided only in one side edge section of the strip-like resin substrate 21 and is not provided in the other side edge section. At least one resin transmitting hole 25 is provided in each row of the semiconductor chip mounting sections, and the position of the resin transmitting hole 25 is located at a position on the prolongation of the row of the through-holes and shifted from the semiconductor chip mounting section 22.

In this connection, each semiconductor chip mounting section 22 may be previously coated with adhesive.

Next, referring to FIGS. 3 to 7, explanations will be made regarding a method of manufacturing the semiconductor device.

First, the semiconductor chip 26 is mounted, using adhesive, on each semiconductor chip mounting section 22 of the wiring substrate 20 so that the semiconductor chip 26 can cover the through-hole 23 while a side of the terminal section of the semiconductor chip 26 is being directed to the mounting section side. The terminal section is exposed to a portion of the through-hole 23. Then, the terminal section of the thus mounted semiconductor chip 26 and the wiring pattern 24 are electrically connected with each other by the bonding wire 29 inserted into the through-hole 23 as shown in FIG. 7.

Figure 3:
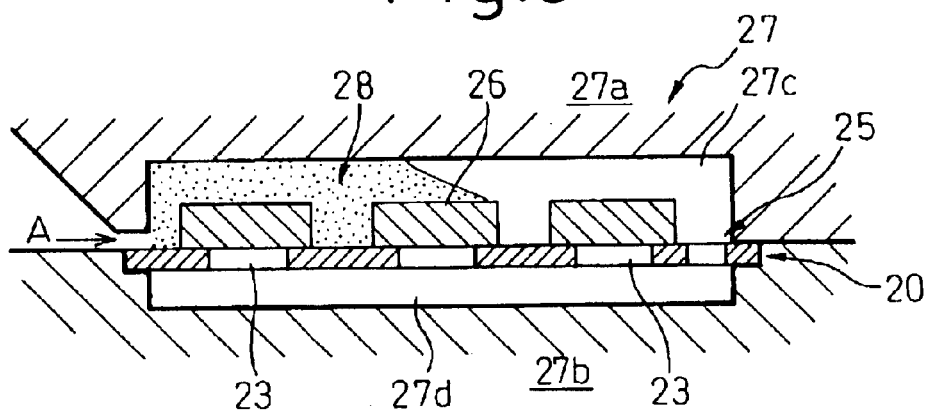
FIG. 3 is a schematic sectional view taken along line x–x' in FIG. 2 illustrating a state of starting the injection of sealing resin.
Figure 7:
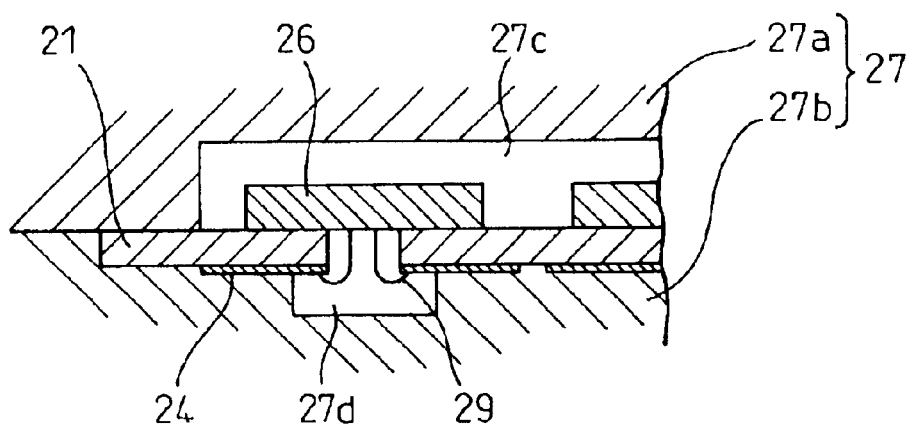
FIG. 7 is a sectional schematic illustration showing a direction of resin pressure.
Figure 8:
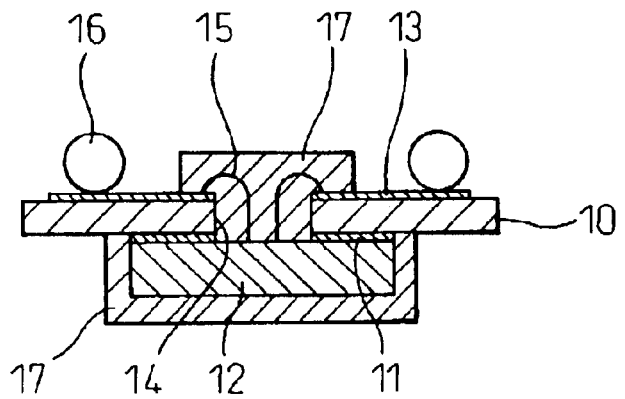
FIG. 8 is a sectional view of a board-on-chip (BOC) type semiconductor device.
Figure 9:
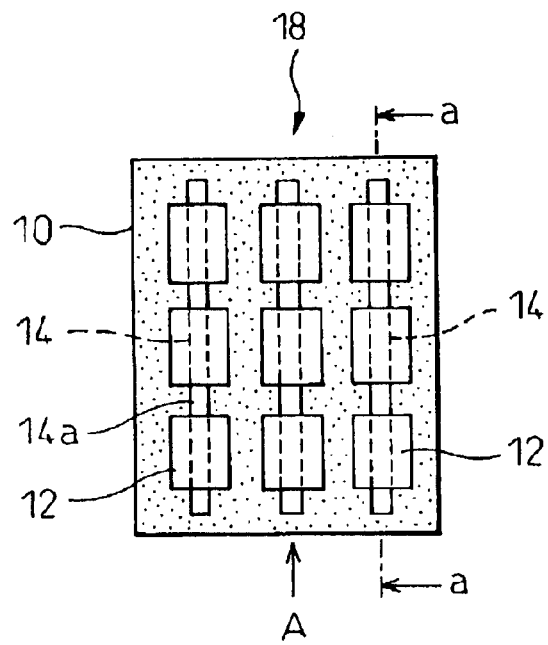
FIG. 9 is a schematic illustration showing an example of a conventional manufacturing method.
Figure 10:
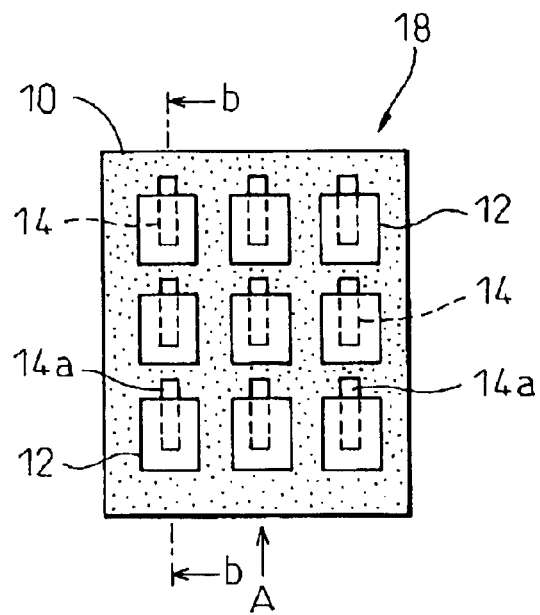
FIG. 10 is a schematic illustration showing another example of a conventional manufacturing method.
Figure 11:
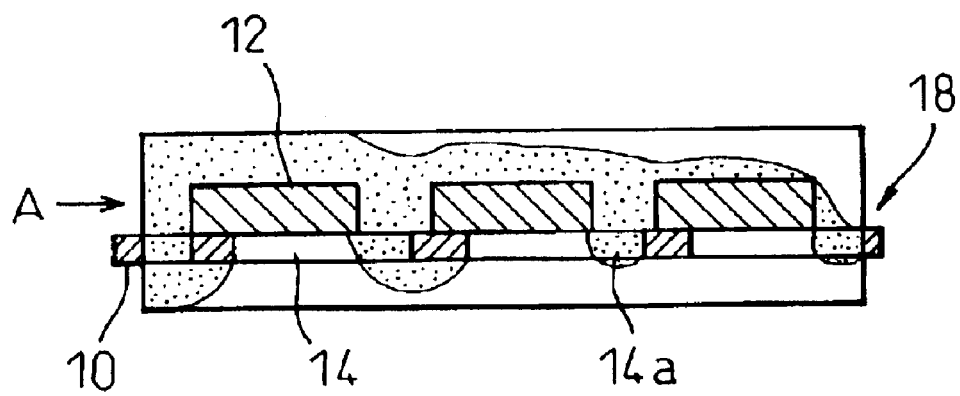
FIG. 11 is a sectional view taken on line a—a in FIG. 9.
Figure 12:
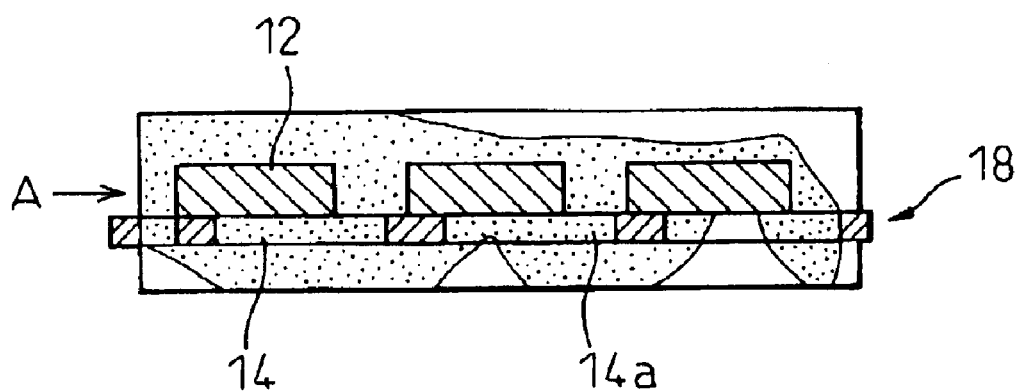
FIG. 12 is a sectional view taken on line b—b in FIG. 10.

The wiring substrate 20 on which the semiconductor chip 26 is mounted as described above is incorporated into the metal mold 27 as shown in FIGS. 3 and 7.

The metal mold 27 includes an upper mold 27a and lower mold 27b. In the upper mold 27a, there is formed a cavity 27c for sealing the semiconductor chip 26 in each row. In the lower mold 27b, there is formed a cavity 27d for sealing the through-hole of each row and the bonding wire 29. Accordingly, the cavities 27c and 27d are communicated with each other only through the resin transmitting hole 25.

Next, the resin 28 used for sealing is injected into the metal mold 27. In this case, the resin 28 used for sealing is injected from the side of arrow A shown in FIG. 3, that is, the resin 28 used for sealing is injected from the side edge portion on the other side of the wiring substrate 20 which is opposite to the side of the resin transmitting hole 25.

Figure 4:
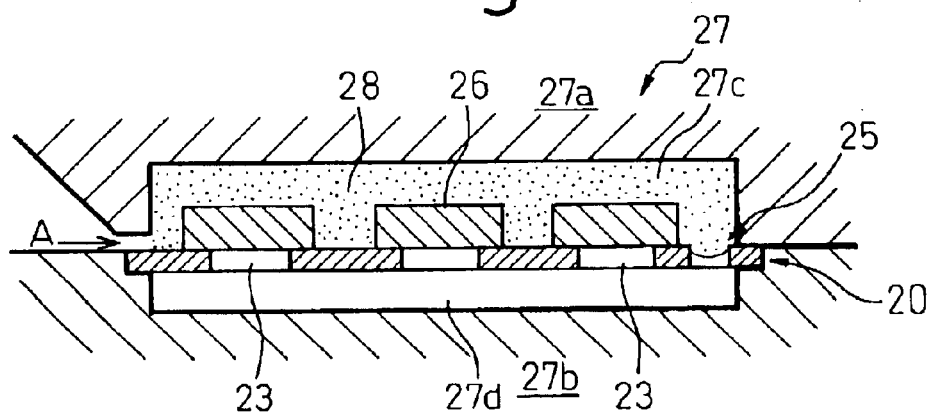
FIG. 4 is a schematic sectional view taken along line x–x' in FIG. 2 illustrating a state in which the semiconductor chip side is filled with resin.
Figure 5:
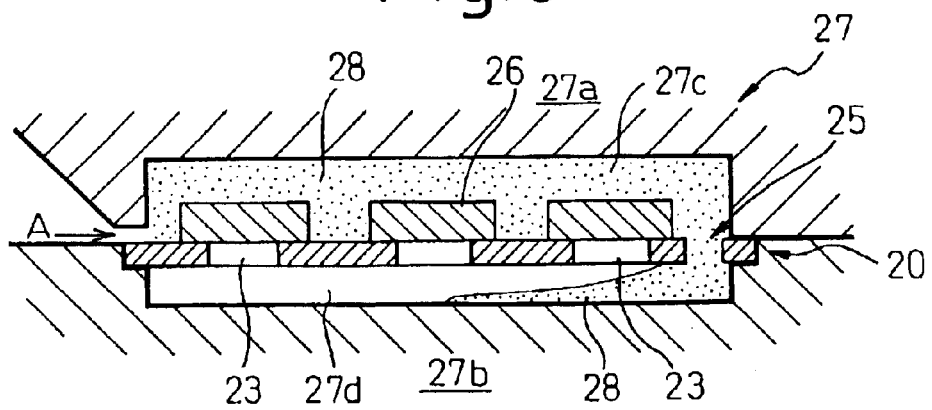
FIG. 5 is a schematic sectional view taken along line x–x' in FIG. 2 illustrating a state in which resin flows onto a reverse face side of a resin substrate from a resin circulation hole.
Figure 6:
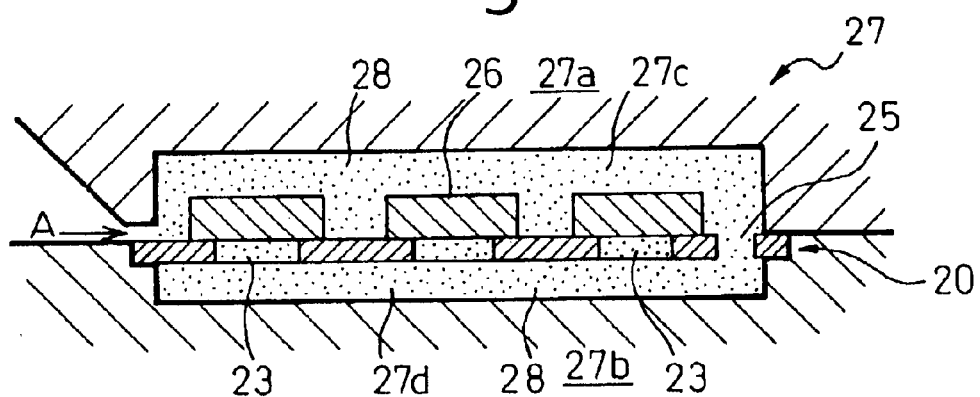
FIG. 6 is a schematic sectional view taken along line x–x' in FIG. 2 illustrating a state in which a reverse face side of a resin substrate is filled with resin.

As the through-hole 23 is blocked by the semiconductor chip 26, the resin 28 fills the cavity 27c on the side of the semiconductor chip 26 as shown in FIG. 4. Then, the resin 28 flows through the resin transmitting hole 25 into the cavity 27d which is the side of forming the wiring pattern 24 of the wiring substrate 20 as shown in FIG. 5. In this way, the resin 28 seals the through-hole 23, a portion of the wiring pattern 24 and the bonding wire 29 as shown in FIG. 6.

As described above, the resin 28 first fills the cavity 27c on the side on which the semiconductor chip 26 exists. At this time, the wiring substrate 20 is pushed in the direction of the parting face of the metal mold 27 by the pressure of resin, that is, the wiring substrate 20 is pushed in the direction of the lower mold 27b. Accordingly, there is no possibility that the resin substrate 21 is raised up. Therefore, the leakage of resin, a burr of the resin and bleeding of a solvent can be prevented.

As described above, after the semiconductor chip 26 and the bonding wire 29 have been sealed by the sealing resin 28, the wiring substrate 20 is picked up from the metal mold, and a solder resist layer is formed in a portion except for the land portion of the wiring pattern 24 although not shown in the drawing. Then, the ball terminal 17 for connecting with the outside is attached to the land portion, and each piece is cut off and separated. In this way, the semiconductor device is completed.

As described above, according to the present invention, it is possible to provide a method of manufacturing a semiconductor device capable of preventing a leakage of resin, a generation of a burr and the bleeding of a solvent.

It should be understood by those skilled in the art that the foregoing description relates to only a preferred embodiment of the disclosed invention, and that various changes and modifications may be made to the invention without departing the sprit and scope thereof.

What is claimed is:

1. A process for manufacturing a semiconductor device comprising:

preparing an insulating substrate having first and second surfaces, a plurality of semiconductor chip mounting sections arranged one by one along a predetermined direction on said first surface extending from one end to the other end of the substrate, and a resin transmitting port opened at said first and second surfaces of the substrate and penetrating therethrough, said resin transmitting port being located at a position in a vicinity of said one end along said predetermined direction and other than the semiconductor chip mounting section arranged nearest to said one end, forming a plurality of through holes within the respective semiconductor chip mounting sections, and forming wiring patterns on said second surface of the substrate;

mounting a semiconductor chip on a respective semiconductor chip mounting section, completely covering a through hole of said plurality of through holes with said semiconductor chip at the first surface and exposing terminals of the semiconductor chip within said through hole, and electrically connecting said terminals of the semiconductor chip to the wiring patterns by means of bonding wires passing through said through hole;

setting a mold define a cavity including first and second cavity sections on said first and second surfaces of the substrate, respectively, in such a manner that said first and second cavities communicate with each other by means of said resin transmitting port; and injecting a sealing resin into said cavity, so that said resin flows through said resin transmitting port to fill both of said first and second cavity sections with the sealing resin.

2. The process as set forth in claim 1, wherein said sealing resin is injected into said cavity through a gate located in a vicinity of said other end of the substrate.

3. The process as set forth in claim 1, wherein said semiconductor chip is mounted on said respective semiconductor chip mounting section by means of an adhesive.

4. The process as set forth in claim 1, wherein said mold comprises a first mold section and a second mold section to nip said substrate from said first and second surfaces thereof, respectively, to define said first and second cavity sections on said first and second surfaces of the substrate, respectively.

5. The process method as set forth in claim 4, wherein said sealing resin is injected into said cavity through a gate provided in one of said first and second mold sections and located in the vicinity of said other end of the substrate, in such a manner that said one of said cavity sections is first filled with resin and then the other of said cavity sections is filled with resin.

6. A process for manufacturing a semiconductor device comprising:

preparing an insulating substrate having first and second surfaces, a plurality of semiconductor chip mounting sections arranged one by one along a predetermined direction on said first surface extending from one end to the other end of the substrate, and a resin transmitting port opened at said first and second surfaces of the substrate and penetrating therethrough, said resin transmitting port being located at a position in the vicinity of said one end along said predetermined direction and other than the semiconductor chip mounting section arranged nearest to said one end;

mounting a semiconductor chip on a respective semiconductor chip mounting section;

setting a mold to define a cavity including first and second cavity sections on said first and second surfaces of the substrate, respectively, in such a manner that said first and second cavities communicate with each other by means of said resin transmitting port; and injecting a sealing resin into said cavity, so that said resin flows through said resin transmitting port to fill both of said first and second cavity sections with the sealing resin, wherein said mold comprises a first mold section and a second mold section to nip said substrate from said first and second surfaces thereof, respectively, to define said first and second cavity sections on said first and second surfaces of the substrate, respectively, and wherein said sealing resin is injected into said cavity through a gate provided in one of said first and second mold sections and located in the vicinity of said other end of the substrate, in such a manner that said one of said cavity sections is first filled with resin and then the other of said cavity sections is filled with resin.

* * * * *

UNITED STATES PATENT AND TRADEMARK OFFICE
CERTIFICATE OF CORRECTION

PATENT NO. : 6,780,681 B2
DATED : August 24, 2004
INVENTOR(S) : Masayoshi Aoki

It is certified that error appears in the above-identified patent and that said Letters Patent is hereby corrected as shown below:

<u>Title page,</u>
Item [57], ABSTRACT,
Line 14, change "rejected" to -- injected --.

Signed and Sealed this

Fourteenth Day of June, 2005

JON W. DUDAS
*Director of the United States Patent and Trademark Office*